(12) United States Patent
Maung et al.

(10) Patent No.: US 7,710,205 B2
(45) Date of Patent: May 4, 2010

(54) CAPACITOR DETECTION BY PHASE SHIFT

(75) Inventors: KyawSwa Maung, Singapore (SG); Manoj Dey, Singapore (SG)

(73) Assignee: Seagate Technology LLC, Scotts Valley, CA (US)

( * ) Notice: Subject to any disclaimer, the term of this patent is extended or adjusted under 35 U.S.C. 154(b) by 15 days.

(21) Appl. No.: 11/287,732

(22) Filed: Nov. 28, 2005

(65) Prior Publication Data

US 2007/0120608 A1  May 31, 2007

(51) Int. Cl.
*H03K 3/02* (2006.01)
*G01R 27/26* (2006.01)

(52) U.S. Cl. .................. 331/1 A; 331/11; 331/111; 331/143; 324/658; 324/678; 324/686

(58) Field of Classification Search .............. 331/1 A, 331/11, 111, 143; 324/548, 658, 661, 662, 324/678, 686
See application file for complete search history.

(56) References Cited

U.S. PATENT DOCUMENTS

| | | | | |
|---|---|---|---|---|
| 4,311,438 A | * | 1/1982 | Comstedt | 417/12 |
| 4,470,008 A | * | 9/1984 | Kato | 327/4 |
| 5,511,418 A | * | 4/1996 | Antikainen et al. | 73/335.03 |
| 5,601,374 A | * | 2/1997 | Cavagnolo | 400/247 |
| 6,087,743 A | * | 7/2000 | Guckel et al. | 310/40 MM |
| 6,498,471 B2 | | 12/2002 | Barker | |
| 6,650,126 B1 | | 11/2003 | Indihar | |
| 6,700,392 B2 | | 3/2004 | Haase | |
| 6,838,887 B2 | | 1/2005 | Denen et al. | |
| 6,894,507 B2 | * | 5/2005 | Morimoto | 324/661 |
| 7,119,552 B2 | * | 10/2006 | Morimoto et al. | 324/661 |
| 7,176,758 B2 | * | 2/2007 | Rein et al. | 330/252 |
| 2006/0066991 A1 | * | 3/2006 | Hirano et al. | 360/97.02 |

* cited by examiner

*Primary Examiner*—Robert Pascal
*Assistant Examiner*—Levi Gannon
(74) *Attorney, Agent, or Firm*—Shumaker & Sieffert, P. A.

(57) ABSTRACT

A method and apparatus for detecting capacitive devices are disclosed. A circuit including two circuit paths is connected to an oscillator voltage source. Connecting a test capacitive device to a path of the circuit modifies the electric potential waveform at a point along the path. Passing the first circuit path through a reference comparator and the second circuit path through a phase-shifting comparator produces two output signals that are phase-shifted with respect to each other when the test capacitive device is functional. Analysis of the output signals allows detection or measurement of the test capacitive device.

23 Claims, 4 Drawing Sheets

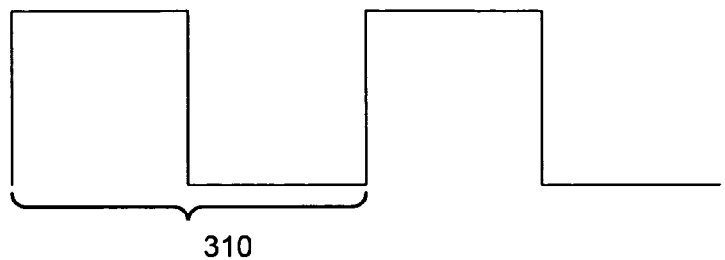
FIG. 3A
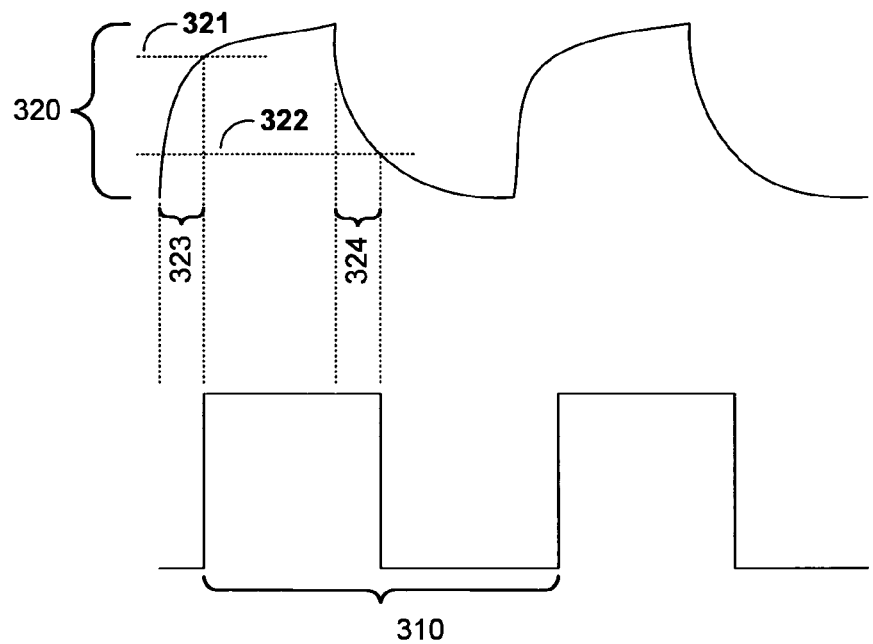
FIG. 3B
FIG. 3C
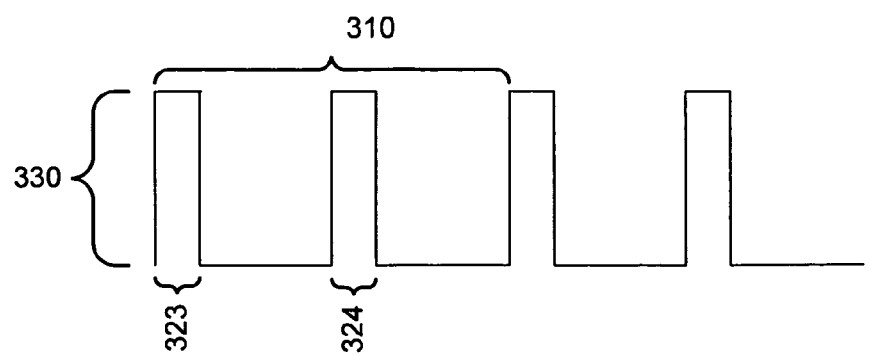
FIG. 3D

CAPACITOR DETECTION BY PHASE SHIFT

TECHNICAL FIELD

The invention relates generally to detection and measurement of electrical parameters and, more particularly, to capacitive device detection and measurement.

BACKGROUND

Printed Circuit Cable Assemblies (PCCAs) for magnetic disc drives incorporate connection traces for micro-actuators. Manufacturers have added filter capacitors whose capacitances are as low as 100 picofarads to the connection traces in PCCAs. The presence of these capacitors must be detected during the PCCA assembly process.

Detection and measurement of capacitive devices is normally performed by applying an alternating current signal to the capacitor being tested and measuring the phase difference between the applied voltage and the current drawn. This method is suboptimal for lower-capacitance capacitors because the difference in current caused by these capacitors is too small to be easily detected.

SUMMARY

A new technique is needed for detecting capacitors that provides an easily detectable signal even when the capacitance of a test capacitive device is as low as 100 picofarads. It would also be desirable to provide a low-cost and easy-to-use technique for measuring very small capacitances.

In general, the present disclosure is directed to a method and apparatus for detecting a capacitive device and, in particular, detecting a capacitive device by using a phase shift.

In one aspect, the present disclosure is directed to a circuit for detecting a capacitive device. The circuit includes an oscillator that generates an output signal, wherein the output signal is substantially periodic; a first circuit path, connected to the output of the oscillator, that includes a first comparator; and a second circuit path, also connected to the output of the oscillator, that includes a second comparator. The oscillator and the comparators have parameters selected so that, when the capacitive device is electrically connected (i.e., connected either directly or indirectly through other circuit components) between the input of the second comparator and ground, the output of the second comparator is phase-shifted with respect to the output of the first comparator.

In another aspect, the present disclosure is directed to a method of detecting a capacitive device including providing an oscillator that generates a substantially periodic signal, providing a first circuit path between the oscillator and the input of a first comparator, providing a second circuit path between the oscillator and the input of a second comparator, connecting the capacitive device between the input of the second comparator and ground, and detecting the capacitive device by comparing the phase of the output of the first comparator to the phase of the output of the second comparator.

The techniques described in this disclosure provide advantages over prior techniques. For example, the signals produced by the comparators may be easier to detect than signals produced by other capacitor detection techniques. Moreover, the magnitude of the signals that permit detection of the capacitive device can be controlled by adjusting parameters of the circuits disclosed other than the capacitance of the capacitive device. In addition, the circuits disclosed can be constructed to be effective for capacitive devices having any capacitance.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

FIGS. 3A-3D are graphs of four waveforms describing the voltage at various points of the phase shift circuit in FIG. 2.

DETAILED DESCRIPTION OF THE PREFERRED EMBODIMENTS

Certain embodiments of the invention will now be described, by way of example, with reference to the accompanying drawings. One skilled in the art will understand that certain features and positions of elements depicted in the figures can be altered or varied without conflicting with or deviating from the scope of the presently disclosed invention.

Figure 1:
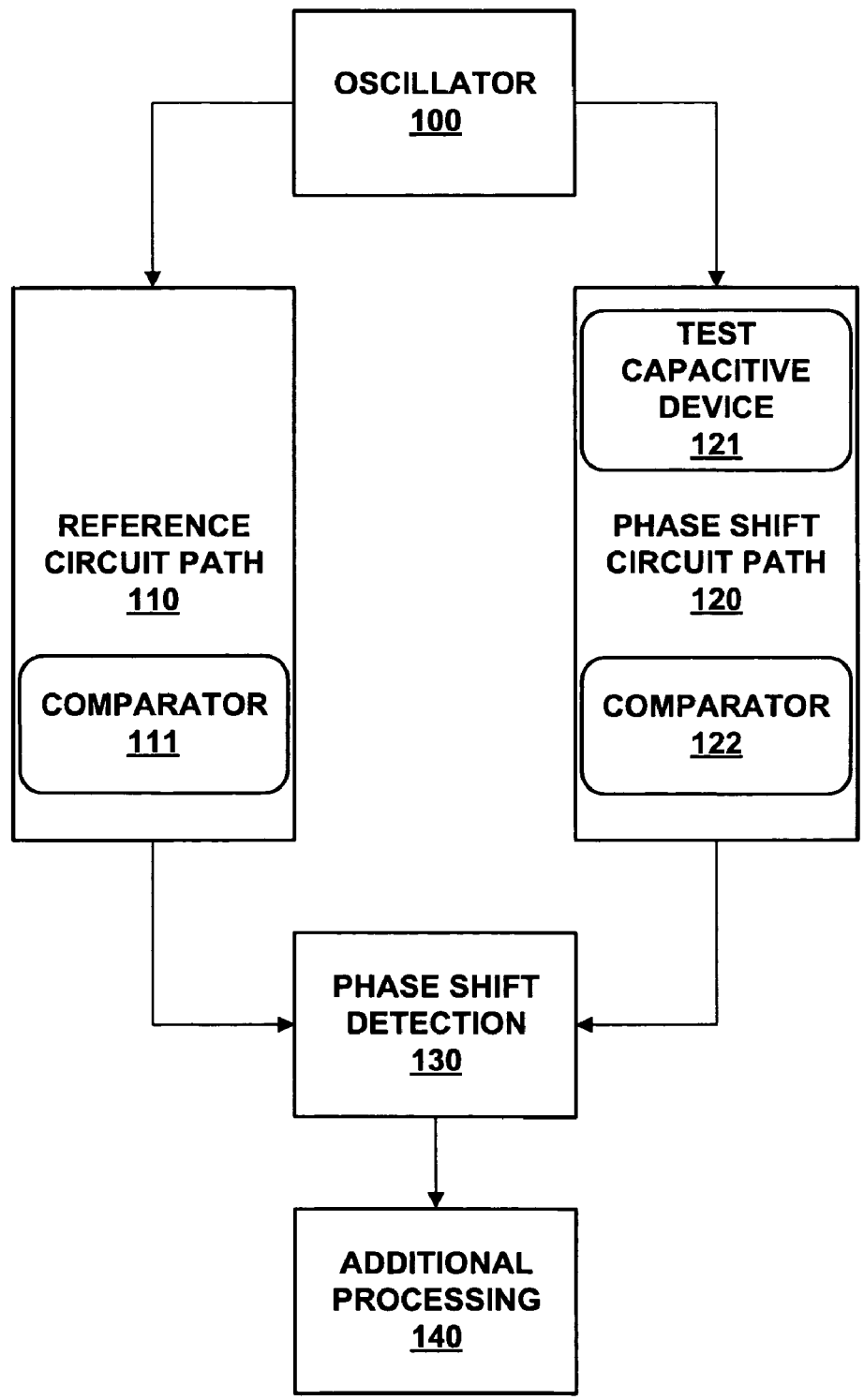
FIG. 1 is a block diagram showing the operation of a capacitive device detector.

FIG. 1 shows a block diagram that provides an overview of a capacitive device detector according to certain embodiments of the invention. An oscillator 100 supplies a periodic signal to a reference circuit path 110 and a phase shift circuit path 120. The reference circuit path 110 includes a reference comparator 111 and may also include other components not shown in FIG. 1. The phase shift circuit path 120 includes a connection to a test capacitive device 121, a phase-shifting comparator 122, and possibly other components not shown in the figure. The signals from the reference circuit path 110 and the phase shift circuit path 120 are then compared using a technique for phase shift detection 130. In some embodiments, additional processing 140 is employed to render the signal in a more useable format.

Figure 2:
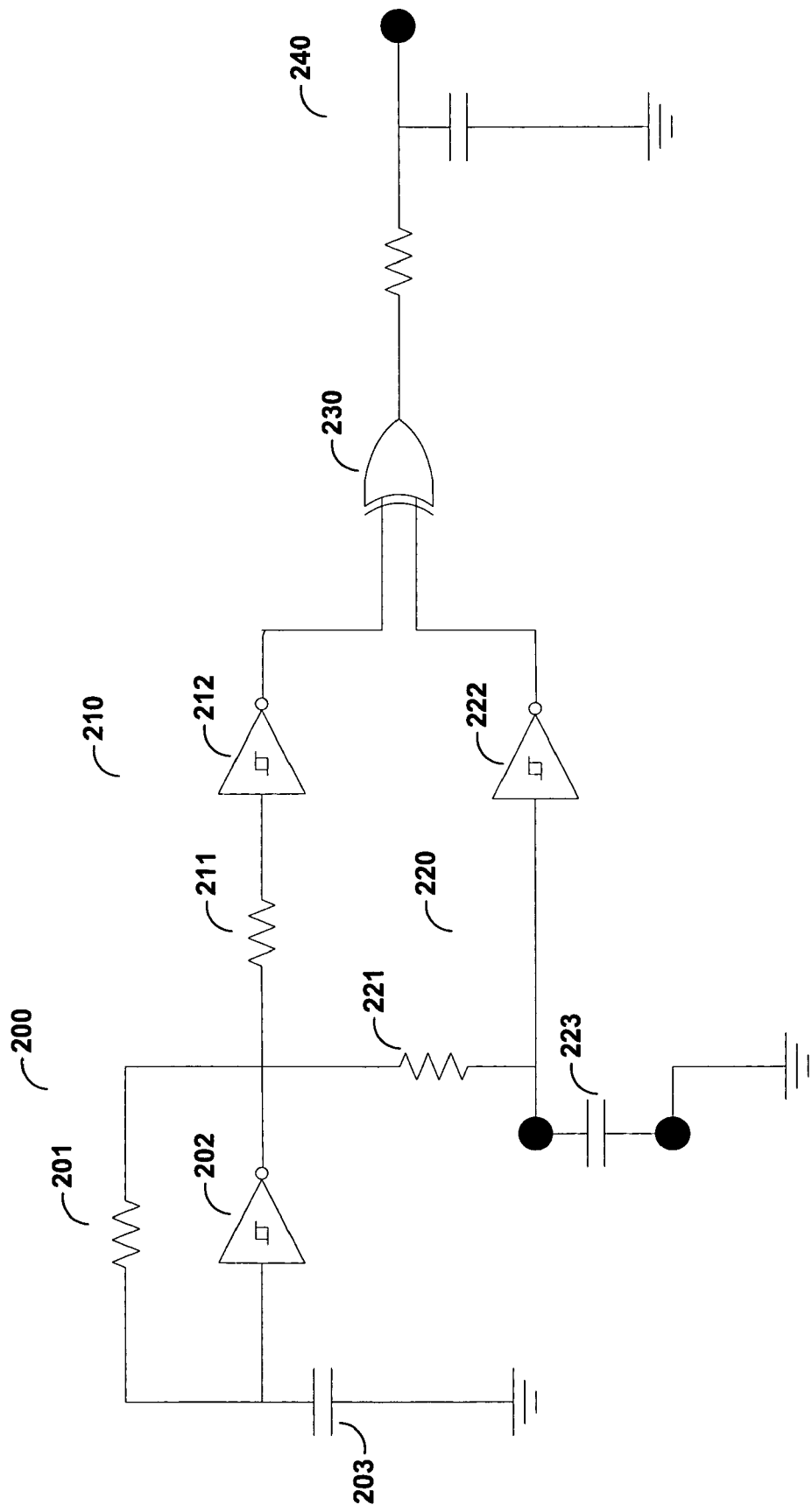
FIG. 2 is a schematic diagram of a phase shift circuit that provides for detecting capacitive device.

FIG. 2 shows a schematic diagram illustrating a phase shift circuit that provides for detecting a test capacitive device 223. The circuit includes an oscillator 200 connected to first and second circuit paths 210 and 220. In the embodiment shown in FIG. 2, the oscillator 200 includes a Schmitt trigger 202, a resistor 201 electrically connected between the input and output of the Schmitt trigger 202, and a capacitor 203 electrically connected between the input of the Schmitt trigger 202 and ground. This type of oscillator is an astable multivibrator that produces a characteristic square wave signal. The period of the signal generated by the oscillator 200 is determined by the magnitudes of the resistor 201 and the capacitor 203.

A Schmitt trigger is a double-threshold comparator that exhibits hysteresis—the output of the trigger depends on both the magnitude of the input and the magnitude of the output. The output of a Schmitt trigger is a digital output—the trigger selects a high or a low output depending on the thresholds of the trigger, the electric potential of the input, and the output. In a non-inverting Schmitt trigger, for example, the output may switch from low to high if and only if the input signal reaches a first, higher threshold while the output is low. In such a comparator, the output may switch from high to low if and only if the input signal reaches a second, lower threshold while the output is high. The use of one or more Schmitt triggers in certain embodiments of the invention is meant to be exemplary only. Other types of comparators may also properly be used in alternative embodiments.

The two circuit paths 210 and 220 of the phase shift circuit may include Schmitt triggers 212 and 222. Preferably, the threshold voltages, shown in FIG. 3B at 321 and 322, of the Schmitt triggers 212 and 222 are substantially equal. The circuit paths 210 and 220 include resistors 211 and 221 between the Schmitt triggers 212 and 222 and the oscillator 200 having substantially equal resistances. The first Schmitt trigger 212 provides a reference output against which the output of the second Schmitt trigger 222 can be compared. In some embodiments, the circuit paths 210 and 220 are configured such that, when no test capacitor 223 is electrically connected to the input of the second circuit path's Schmitt trigger 222, the signals at the outputs of both Schmitt triggers 212 and 222 are substantially the same.

When a test capacitive device 223 is added to the second circuit path 220, between the input of the second Schmitt trigger 222 and ground, for example, the signal at the input of the second Schmitt trigger 222 becomes an exponential charge and discharge waveform. As the capacitance of the test capacitive device 223 increases, the period between the beginning of the change or discharge cycle and the point where the waveform reaches a threshold voltage increases. This period produces a phase shift in the output of the second Schmitt trigger 222 when compared to output of the first Schmitt trigger 212.

In the embodiment shown in FIG. 2, an XOR logic gate 230 accepts the outputs of the reference Schmitt trigger 212 and the phase-shifting Schmitt trigger 222. The XOR gate 230 outputs a high signal if and only if the gate's input signals are unequal. If the first input signal remains at a constant phase, then a phase shift in the signal at the second input of the XOR gate, introduced by the presence of a test capacitive device, causes the output of the gate to have a combined duty cycle that is proportional to the capacitance of the test capacitive device.

In the embodiment shown in FIG. 2, a low-pass filter 240 is electrically connected to the output of the logic gate 230. The low-pass filter 240 averages the signal at the logic gate's output. Thus, the output electric potential is proportional to the combined duty cycle of the gate's output. The difference between the output electric potential when a test capacitive device 223 is present and the potential when the capacitive device 223 is absent is sufficiently large to be inexpensively measured, even when the capacitance of the test capacitive device 223 is as low as 100 picofarads. The embodiment shown in FIG. 2 provides one simple way of interpreting the output of the logic gate 230. Other techniques for interpreting the output of the comparators 212 and 222 and/or the logic gate 230 are also within the scope of this disclosure.

FIGS. 3A-3D show graphs of four exemplary electric potential waveforms at various points of interest in the phase shift circuit shown in FIG. 2. These waveforms are plotted with the assumption that the output of the oscillator 200 is substantially a square wave signal. FIG. 3A is a waveform of the electric potential at the output of the first (reference) Schmitt trigger 212. FIG. 3B is a waveform of the electric potential at the input of the second (phase shifting) Schmitt trigger 222 when a test capacitive device 223 is connected between the input of the Schmitt trigger 222 and ground. FIG. 3C is a waveform of the electric potential at the output of the phase shifting Schmitt trigger 222. FIG. 3D is a waveform of the electric potential at the output of the XOR gate 230, where the inputs of the XOR gate 230 are electrically connected to the outputs of the Schmitt triggers 212 and 222.

Both Schmitt trigger outputs have the same period 310 (T) as the period of the oscillator output. In some embodiments, the threshold voltages 321 and 322 ($V_{t+}$ and $V_{t-}$) of the phase shifting Schmitt trigger 222 are selected so that both thresholds fall within the range of electric potentials reached by the charge and discharge waveform. In these embodiments, the electric potential waveform during the charging cycle in FIG. 3B is given by the equation:

$$v(t)=V(1-e^{-t/\tau}). \tag{1}$$

The electric potential waveform during the discharging cycle in FIG. 3B is given by the equation:

$$v(t)=Ve^{-t/\tau}. \tag{2}$$

In these equations, t represents the time that elapses from the beginning of a charge or a discharge cycle until the electric potential crosses the high threshold 321 or the low threshold 322 of the phase shifting Schmitt trigger 222. Meanwhile, $\tau$ represents the charge and discharge cycle time constant, which is equal to the product of the resistance R of the resistor 221 in the second circuit path 220 and the capacitance C of the test capacitive device 223. V represents the amplitude 320 of the charge and discharge waveform in FIG. 2B, and it is approximately equal to the amplitude of the output of the oscillator 200.

The phase shift 323 of the rising edge ($t_{SR}$) is the time at which the charging cycle reaches the high threshold 321 ($V_{t+}$) of the phase shifting Schmitt trigger 222. At that time, the electric potential at the input of the Schmitt trigger 222, from equation 1, is:

$$V_{t+}=V(1-e^{-t_{SR}/RC}). \tag{3a}$$

Solving for $t_{SR}$ produces an expression for the phase shift 323 of the charging cycle:

$$t_{SR} = -RC\ln\left(1 - \frac{V_{t+}}{V}\right) \tag{3b}$$

Following a similar procedure for the phase shift 324 of the falling edge $t_{SF}$ by starting with equation 2 produces an expression for the falling phase shift 324 in terms of the negative threshold 322 ($V_{t-}$) of the phase shift Schmitt trigger 222:

$$t_{SF} = -RC\ln\frac{V_{t-}}{V} \tag{4}$$

FIG. 3D shows that the output of the XOR gate will have a combined duty cycle of $t_{SR}+t_{SF}$. When a low-pass filter, integrator circuit, or other averaging mechanism is attached to the output of the gate 230, the output voltage $V_{out}$ will be the time average of the duty cycle produced by the XOR gate 230. An expression for $V_{out}$ in terms of the output amplitude 330 of the XOR gate ($V_D$) is:

$$V_{out} = \frac{V_D(t_{SR} + t_{SF})}{T} \tag{5}$$

By substituting equations 3b and 4 into equation 5 and rearranging terms, an expression for the capacitance C of the test capacitive device 223 in terms of the measured output voltage $V_{out}$ and known circuit parameters T, R, $V_D$, V, $V_{t+}$, and $V_{t-}$ is obtained:

$$C = -V_{out} \frac{T}{RV_D \ln\left[\left(1 - \frac{V_{t+}}{V}\right)\frac{V_{t-}}{V}\right]} \quad (6)$$

Figure 4:
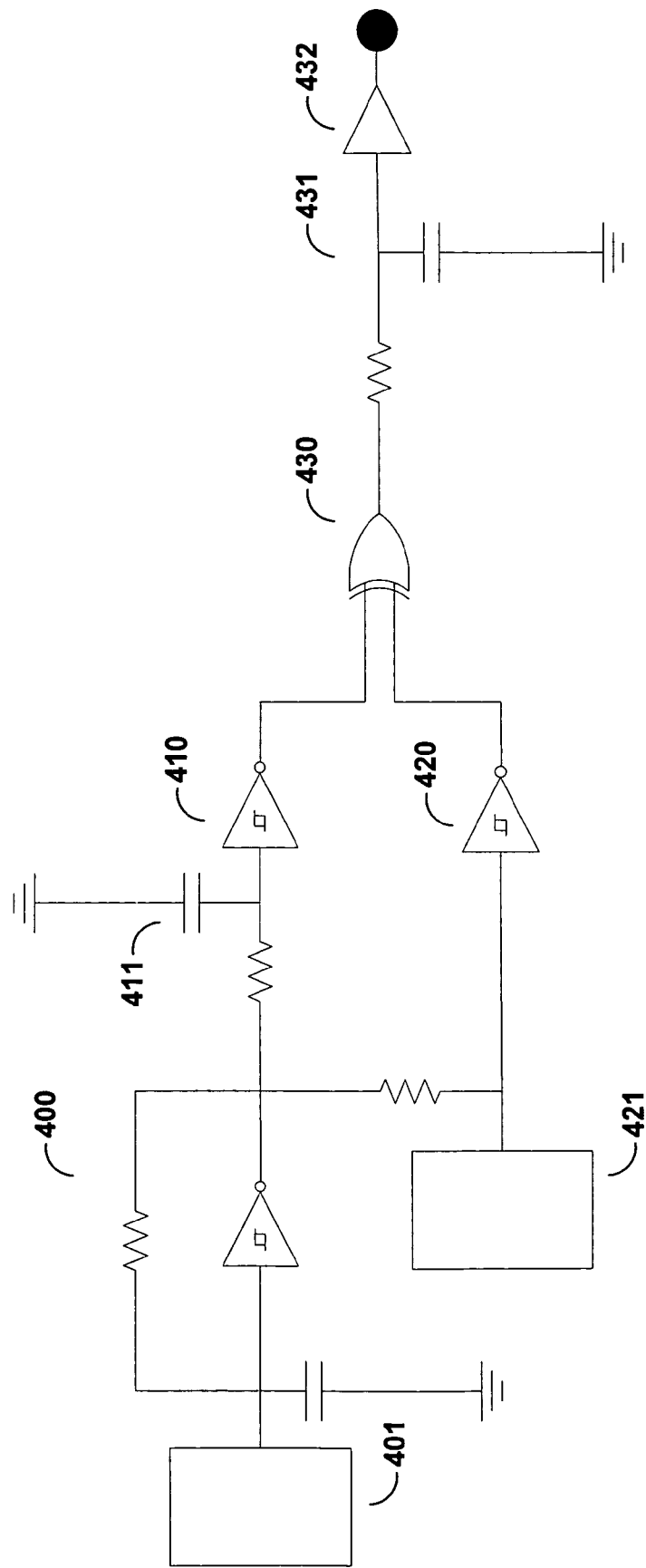
FIG. 4 is a schematic diagram of a phase shift circuit that provides for detecting multiple capacitive devices having varying capacitances.

FIG. 4 is a schematic diagram illustrating an alternative phase shift circuit capable of detecting capacitive devices. Some embodiments incorporate a tester that determines whether the output voltage of the phase shift circuit falls within a range, signifying that a functioning test capacitive device is connected to the circuit. Other embodiments translate the output voltage of the circuit into the capacitance of the test capacitive device, using the expressions derived above, for example.

Some exemplary embodiments include SN74AHC14 CMOS Hex Schmitt Triggers for use in connection with an oscillator 400, a reference comparator 410, or a phase shifting comparator 420. In some embodiments, use of CMOS comparator circuits is beneficial. CMOS circuits typically have high input resistance and do not have an input pull-up resistor, a feature found in some TTL circuits, that may interfere with the charge and discharge cycles of the oscillator and the comparators. In some embodiments, use of single-chip comparators is beneficial. Single-chip devices help ensure that the characteristics, such as the propagation delay, of the reference and phase-shifting comparators 410 and 420 are closely matched and that the potential shift caused by any mismatch is minimal.

In the embodiment shown in FIG. 4, the input to the phase-shifting comparator 420 is electrically connected to a multiplexer 421, which selects the capacitive device to be tested. Connection of the multiplexer 421 introduces additional parasitic and other capacitances to the input of the phase-shifting comparator 420. The addition of a fixed capacitor 411 to the input of the reference comparator 410 may compensate for the increased capacitance at the input of the phase-shifting comparator 420. The capacitance of the fixed capacitor 411 may be selected such that the phase of the reference comparator's output is shifted by a fixed amount so that when no test capacitive device is selected by the multiplexer 421, the outputs of the comparators 410 and 420 will have the same phase.

The embodiment in FIG. 4 includes an oscillator 400 that incorporates a capacitor that is selectable through a multiplexer 401. The multiplexer 401 allows the oscillator's capacitor to be selected so that the period of the oscillator's output is large enough to accommodate the charge and discharge cycles at the input of the phase-shifting comparator 420. For example, selecting a period that is at least approximately ten times the product of the capacitance of the test capacitive device 223 and the resistance of the resistor 221 along the second circuit path 220 produces a more easily detectable phase shift in the output of phase-shifting comparator 420. Making the oscillator's capacitor selectable through the multiplexer 401 allows adjustment of the oscillator's period so that detection and measurement of test capacitive devices having varying capacitances is possible.

In the embodiment shown in FIG. 4, the output signal of the phase shift circuit is passed through a logic gate 430, a low-pass filter 431, and a buffer 432. The buffer 432 may be, for example, an op amp buffer circuit that provides an output that is substantially equal to its input and that is substantially isolated from any devices or components electrically connected to the output of the buffer. In other embodiments, the output of the logic gate may be connected to an integrator circuit.

Various embodiments of the invention have been described. These and other embodiments are within the scope of the following claims.

The invention claimed is:

1. A circuit for detecting a capacitive device comprising:
   an oscillator that generates an output signal, wherein the output signal is substantially periodic, and wherein the oscillator comprises a capacitor that is selectable through a first multiplexer to allow for adjustment of a period of the output signal;
   a first circuit path connected to an output of the oscillator, wherein the first circuit path comprises a first comparator having an input and an output; and
   a second circuit path connected to the output of the oscillator, wherein the second circuit path comprises a second comparator having an input and an output, and wherein an electrical phase of the output signal from the oscillator is substantially equal at an input to the first circuit path and an input to the second circuit path;
   a second multiplexer that selects the capacitive device to electrically connect the capacitive device between the input of the second comparator and ground, wherein, when the capacitive device is selected through the second multiplexer, the output of the second comparator is phase-shifted with respect to the output of the first comparator, and wherein, when no capacitive device is selected through the second multiplexer, a phase of the output of the first comparator is substantially the same as a phase of the output of the second comparator; and
   a phase shift detector that compares the phase of the output of the first comparator to the phase of the output of the second comparator.

2. The circuit of claim 1, wherein the phase shift detector comprises a logic gate having a first input, a second input, and an output, wherein the first input is electrically connected to the output of the first comparator, wherein the second input is electrically connected to the output of the second comparator, and wherein the output of the logic gate depends on both inputs to the logic gate.

3. The circuit of claim 2, further comprising a buffer electrically connected to the output of the logic gate whereby the buffer diminishes the effect of downstream loads on the output of the logic gate.

4. The circuit of claim 2, further comprising an integrator circuit electrically connected to the output of the logic gate.

5. The circuit of claim 2, further comprising a low-pass filter electrically connected to an output of the logic gate.

6. The circuit of claim 1, wherein the first comparator comprises a Schmitt trigger.

7. The circuit of claim 1, wherein the second comparator comprises a Schmitt trigger.

8. The circuit of claim 1, wherein the oscillator further comprises:
   a Schmitt trigger having an input and an output; and
   a resistor electrically connected between the input and the output of the Schmitt trigger, wherein the capacitor of the oscillator is electrically connected between the input of the Schmitt trigger and ground.

9. The circuit of claim 1, wherein the capacitor is a first capacitor, and wherein the circuit further comprises a second capacitor electrically connected between the input of the first comparator and ground, wherein the capacitance of the second capacitor is selected so that the phase of the output of the first comparator is substantially the same as the phase of the output of the second comparator when no capacitive device is selected through the second multiplexer.

10. The circuit of claim 1, further comprising:
a first resistor electrically connected between the output of the oscillator and the input of the first comparator; and
a second resistor electrically connected between the output of the oscillator and the input of the second comparator.

11. The circuit of claim 10, wherein the period of the output signal is selected to be at least approximately ten times greater than the product of the resistance of the second resistor and the capacitance of the capacitive device.

12. The circuit of claim 1, wherein the capacitor for the oscillator is selected such that the period of the substantially periodic signal is large enough to accommodate the charge and discharge cycles of the second comparator.

13. The circuit of claim 1, wherein the output signal is a first output signal, and wherein the phase shift detector comprises a logic gate that generates a second output signal that is substantially periodic based on the output of the first comparator and the output of the second comparator, and wherein a duty cycle of the second output signal is related to an amount of phase-shift between the output of the first comparator and the output the second comparator.

14. A method of detecting a capacitive device comprising:
generating a substantially periodic signal with an oscillator, wherein the oscillator comprises a capacitor that is selectable through a first multiplexer to allow for adjustment of a period of the substantially periodic signal;
providing a first circuit path connected to an output of the oscillator, wherein the first circuit path comprises a first comparator having an input and an output;
providing a second circuit path connected to the output of the oscillator, wherein the second circuit path comprises a second comparator having an input and an output, and wherein an electrical phase of the substantially periodic signal generated with the oscillator is substantially equal at an input to the first circuit path and an input to the second circuit path;
selecting the capacitive device through a second multiplexer to connect the capacitive device between the input of the second comparator and ground, wherein a phase of the output of the first comparator is substantially the same as a phase of the output of the second comparator when no capacitive device is selected through the second multiplexer; and
detecting the capacitive device by comparing the phase of the output of the first comparator to the phase of the output of the second comparator.

15. The method of claim 14, wherein detecting the capacitive device further comprises providing a logic gate having a first input electrically connected to the output of the first comparator, a second input electrically connected to the output of the second comparator, and an output that depends on both inputs to the logic gate.

16. The method of claim 15, further comprising calculating the capacitance of the capacitive device from the output of the logic gate.

17. The method of claim 14, further comprising calculating the capacitance of the capacitive device from the outputs of the comparators.

18. The method of claim 14, further comprising:
electrically connecting a first resistor between the output of the oscillator and the input of the first comparator; and
electrically connecting a second resistor between the output of the oscillator and the input of the second comparator.

19. The method of claim 18, further comprising selecting the capacitor for the oscillator so that a period of the substantially periodic signal is at least approximately ten times greater than the product of the resistance of the second resistor and the capacitance of the capacitive device.

20. The method of claim 14, further comprising generating an output signal that is substantially periodic based on the output of the first comparator and the output of the second comparator, wherein a duty cycle of the output signal is related to a capacitance of the capacitive device.

21. The method of claim 14, wherein the capacitor is a first capacitor, wherein the method further comprises providing a second capacitor electrically connected between the input of the first comparator and ground, and wherein the capacitance of the second capacitor is selected so that the phase of the output of the first comparator is substantially the same as the phase of the output of the second comparator when no capacitive device is selected through the second multiplexer.

22. A device comprising:
means for generating a substantially periodic signal, wherein the means for generating the substantially period signal comprises a capacitor that is selectable through a multiplexer to allow for adjustment of a period of the substantially periodic signal;
means for carrying the substantially periodic signal to a first comparator;
means for carrying the substantially periodic signal to a second comparator, wherein an electrical phase of the substantially periodic signal is substantially equal at an input to the means for carrying the substantially periodic signal to the first comparator and at an input to the means for carrying the substantially periodic signal to the second comparator;
means for selecting the capacitive device to electrically connect the capacitive device between an input of the second comparator and ground, wherein a phase of an output of the first comparator is substantially the same as a phase of an output of the second comparator when no capacitive device is selected through the means for selecting; and
means for detecting the capacitive device from output signals of both the first comparator and the second comparator.

23. The device of claim 22, wherein the capacitor is a first capacitor, wherein the device further comprises, a second capacitor electrically connected between an input of the first comparator and ground and wherein the capacitance of the second capacitor is selected so that the phase of the output of the first comparator is substantially the same as the phase of the output of the second comparator when no capacitive device is selected through the means for selecting.

* * * * *